United States Patent

Ogawa et al.

Patent Number: 5,585,147
Date of Patent: Dec. 17, 1996

[54] PROCESS FOR A SURFACE TREATMENT OF A GLASS FABRIC

[75] Inventors: Satoru Ogawa, Hirakata; Yasushi Sawada, Neyagawa; Masahiro Matsumura, Katano; Yoshihiko Nakamura, Nishinomiya, all of Japan

[73] Assignee: Matsushita Electric Works, Ltd., Osaka, Japan

[21] Appl. No.: 446,476

[22] Filed: May 22, 1995

[30] Foreign Application Priority Data

Jun. 28, 1994 [JP] Japan .................... 6-145959

[51] Int. Cl.$^6$ ........................... H05H 1/00
[52] U.S. Cl. ............ 427/535; 427/255.3; 427/299; 427/561; 427/570; 427/574; 427/578
[58] Field of Search ................ 427/534, 535, 427/569, 570, 307, 255.3, 299, 561, 574, 578

[56] References Cited

U.S. PATENT DOCUMENTS

| | | | |
|---|---|---|---|
| 5,124,173 | 6/1992 | Uchiyama et al. | 427/38 |
| 5,275,665 | 1/1994 | Okazaki et al. | 118/723 E |

FOREIGN PATENT DOCUMENTS

| | | |
|---|---|---|
| 62-111493 | 5/1987 | Japan . |
| 641733 | 1/1989 | Japan . |
| 641734 | 1/1989 | Japan . |
| 641735 | 1/1989 | Japan . |

*Primary Examiner*—Bernard Pianalto
*Attorney, Agent, or Firm*—Watson Cole Stevens Davis, P.L.L.C.

[57] ABSTRACT

A surface treatment of a glass fabric used for a fiber reinforced composite such as multilayer circuit boards comprises the steps of exposing the glass fabric to an atmospheric pressure plasma of a mixture gas to obtain a plasma-treated surface of the glass fabric, and coating an organosilane compound on the plasma-treated surface. The mixture gas contains as a reaction gas at least one of an oxidative gas and a fluorine-containing gas, and a rare gas as a carrier of the reaction gas. The mixture gas is pre-heated prior to the plasma excitation thereof. When the glass fabric includes an organic compound as a sizing agent, the organic compound can be efficiently removed from the glass fabric by the exposing step. For example, the organosilane compound can be coated on the plasma-treated surface by exposing the plasma-treated surface to a second atmospheric pressure plasma of a second mixture gas containing an organosilane monomer. The surface treatment of the present invention is useful to efficiently produce a multilayer circuit board having excellent adhesion between the glass fabric and a resin, and resistance to CAF (Conductive Anodic Filaments).

14 Claims, 2 Drawing Sheets

PROCESS FOR A SURFACE TREATMENT OF A GLASS FABRIC

BACKGROUND OF THE INVENTION

1. Field of the Invention

The present invention relates a surface treatment of a glass fabric used for a fiber reinforced composite such as multilayer circuit boards.

2. Disclosure of the Prior Art

In the past, glass yarns coated with an organic compound are woven to obtain a glass fabric used to make a fiber reinforced composite such multilayer circuit boards. The organic compound is called as a sizing agent and acts as a protecting film for the glass yarns. After a weaving step the glass fabric is heated at about 400° C. over a period of several tens of hours to remove the organic compound from the glass fabric. This heat treatment is known as a heat-cleaning treatment. Subsequently the glass fabric, free of the organic compound, is treated with a coupling agent to improve adhesion between the glass fabric and a resin which is used at a later stage of manufacturing the multilayer circuits boards. An organosilane compound can be used as the coupling agent. For example, the glass fabric may be dipped in a solution including the coupling agent diluted with an organic solvent or water. The resin is impregnated into the treated glass fabric to a form a prepreg. The multilayer circuit board can be manufactured by stacking and compressing a plurality of copper foils and prepregs.

When the organic compound is not sufficiently removed from the glass fabric by the heat-cleaning treatment, there arises a problem of decreasing the adhesion between the glass fabric and the resin because the glass fabric can not be uniformly treated with the coupling agent. In addition, when carbon is left on the glass fabric as a residue of the organic compound, there is a probability of adversely influencing the insulating property of the fiber reinforced composite.

Thus, the heat-cleaning treatment is an important step necessary for producing good multilayer circuit boards. However, as described above, since the heat-cleaning treatment requires heating the glass fabric at about 400° C. over the period of several tens of hours, there is a problem of providing a low production rate of the glass fabric, free of the organic compound, in spite of using a relatively large amount of energy. To improve the production rate, Japanese Patent Early Publications [KOKAI] Nos. 62-111493 and 64-1733 to 1735 propose to perform a plasma treatment to the glass fabric under a reduced pressure to remove the organic compound from the glass fabric, or perform the plasma treatment simultaneously with the heat-cleaning treatment. However, since the plasma treatment is performed under a reduced pressure, there is a problem of requiring an expensive and complex furnace with a vacuum apparatus.

On the other hand, for small-sizing electronic devices and providing high performance to the devices, it is desired to produce printed circuit boards or multilayer printed boards having high-density circuits. In particular, as a distance between through-holes or a distance between a conductive pattern of an internal layer of the multilayer printed board and a through-hole becomes to be shorter to form the high-density circuits, there arises an undesired phenomenon of deteriorating the insulating property therebetween. As one of the reasons for such a phenomenon, the influence of copper migration should be considered. The copper migration is explained as follows. That is, when an electric potential is applied between copper circuits under the condition of high humidity, copper of the circuit corresponding to an anode is dissolved, and the dissolved copper diffuses through an insulating portion and deposits on the copper circuit corresponding to a cathode, so that the insulation between the circuits is broken. When the copper migration happens at the interface between a resin and the glass fabric which is located between the through-holes or between the through-hole and the conductive pattern of the internal layer, it is called a CAF (Conductive Anodic Filaments). It is believed that the CAF is caused by an insufficient adhesion between the resin and the glass fabric. In other words, it is believed that the CAF happens through a clearance between the resin and glass fabric which is caused when the adhesion therebetween is poor, or by damages of drilling of the through-holes. Therefore, it is possible to prevent the occurrence of the CAF by improving the adhesion between the resin and glass fabric.

Consequently, a more effective surface-treatment of the glass fabric is desired to improve the above described problems.

SUMMARY OF THE INVENTION

A primary object of the present invention is to provide a process for a surface treatment of a glass fabric for improving the above problems. That is, the process comprises the steps of exposing the glass fabric to an atmospheric pressure plasma of a mixture gas including a reaction gas to obtain a plasma-treated surface of the glass fabric, and coating an organosilane compound on the plasma-treated surface of the glass fabric.

By exposing the glass fabric including an organic compound as a sizing agent to the atmospheric pressure plasma, the organic compound can be efficiently removed from the glass fabric. On the other hand, by exposing a glass fabric, to which a heat-cleaning treatment is performed prior to the exposing step of the present invention, to the atmospheric pressure plasma, it is possible to remove a residue, e.g., carbon, of the sizing agent left on the glass fabric after the heat-cleaning treatment. In addition, the moisture or impurity adsorbed on the glass fabric after the heat-cleaning treatment can be removed by the exposing step. Therefore, the exposing step of the present invention is useful to improve adhesion between the organosilane compound and the glass fabric and prevent the occurrence of CAF (Conductive Anodic Filaments). Since the mixture gas is preheated prior to a plasma excitation thereof, it is possible to uniformly provide the above described effects of the exposing step to the glass fabric.

It is preferred that the reaction gas is at least one of an oxidative gas and a fluorine-containing gas. It is also preferred that the reaction gas is one of a hydrogen-containing gas and a mixture gas of hydrogen gas and the fluorine-containing gas. In particular, when the reaction gas contains the fluorine-containing gas, the glass fabric is etched by the atmospheric pressure plasma to form a finely-roughened surface on the glass fabric. The roughened surface is useful to improve the adhesion between the coupling agent and the glass fabric.

It is also preferred that the exposing step comprises the sub-steps of exposing the glass fabric to a first atmospheric pressure plasma of a first reaction gas containing the oxidative gas to obtain a pre-treated surface of the glass fabric, and exposing the pre-treated surface to a second atmospheric pressure plasma of a second reaction gas containing the fluorine-containing gas to obtain the plasma-treated surface of the glass fabric.

Other features, advantages and effects of the present invention will become apparent by the detailed explanation below with the attached drawings.

DETAILED DESCRIPTION OF THE INVENTION

A process for a surface treatment of a glass fabric of the present invention is explained in detail. The process comprises the following first and second steps. The first step is characterized by exposing the glass fabric to an atmospheric pressure plasma of a mixture gas containing a reaction gas to obtain a plasma-treated surface of the glass fabric. In the first step, the mixture gas is pre-heated prior to the plasma excitation thereof. The second step is characterized by coating an organosilane compound on the plasma-treated surface of the glass fabric.

The pre-heating of the mixture gas is very important to uniformly and efficiently perform the first step. That is, in case of performing a plasma treatment to a substrate under a reduced pressure, since an amount of thermal energy supplied from the plasma to the substrate is small, it is generally required to heat the substrate to enhance the plasma treatment. However, as a scale of the substrate is larger, it would be more difficult to uniformly heat the substrate, in other words, uniformly perform the plasma treatment to the substrate.

In case of performing a plasma treatment to the substrate under atmospheric pressure, the thermal energy required to heat the substrate can be supplied by a gas convection. The heat transfer by the gas convection can not be attained under reduced pressure. Therefore, even when the substrate is a relatively large scale, it is possible to uniformly perform the plasma treatment to the substrate without using a heater or the like.

Figure 1:
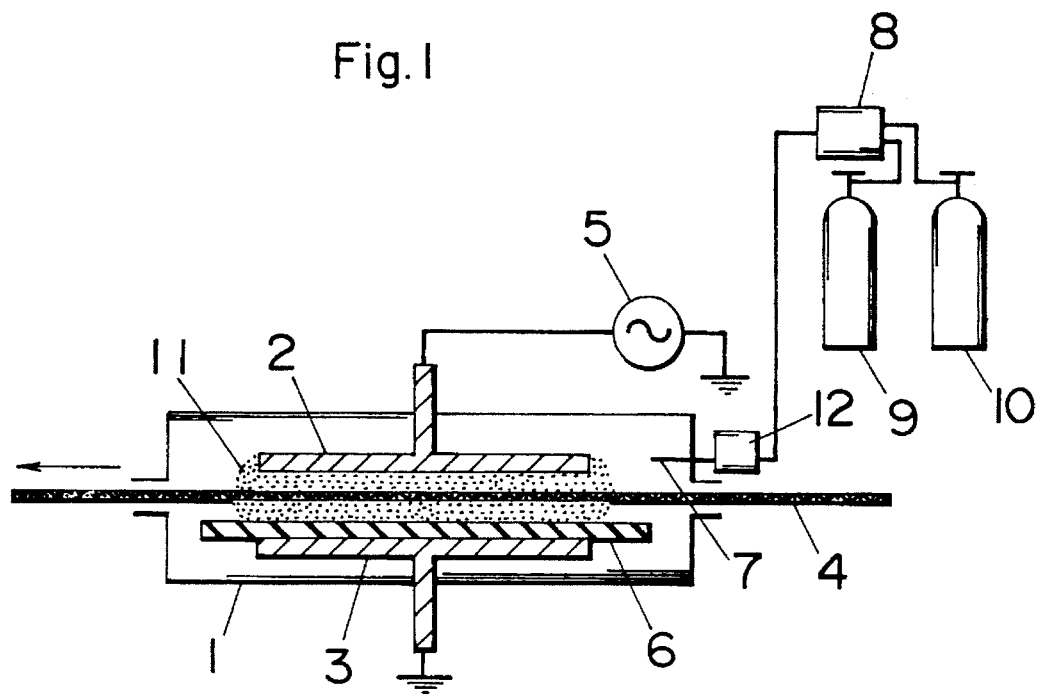
FIG. 1 is a schematic diagram of a plasma reaction apparatus used in the present invention.

For example, a plasma reaction apparatus shown in FIG. 1 may be used for the first step of the present invention. The apparatus comprises a tube-like reaction chamber 1, a gas inlet 7 for supplying the mixture gas into the reaction chamber 1, and a pair of upper and lower electrodes 2 and 3 for exciting the atmospheric pressure plasma 11 of the mixture gas. The upper electrode 2 is disposed parallel to the lower electrode 3 and spaced away from the lower electrode 3 by a predetermined distance. The electrodes 2 and 3 are insulated from the reaction chamber 1. A solid-dielectric 6 is placed on the lower electrode 3 between the electrodes 2 and 3. The solid-dielectric 6 is useful to prevent the occurrence of an arc discharge and to maintain a glow discharge during the plasma excitation. It is possible to place the solid-dielectric on the upper electrode, or solid-dielectrics both the electrodes, respectively. The upper electrode 2 is connected to an alternating-current power source 5. It is preferred that the power source 5 can provide an alternating-current power of a frequency of 50 Hz to 13.56 MHz. The lower electrode 3 is connected to the earth. A thermocouple (not shown) is inserted into the reaction chamber 1 to monitor a temperature of the mixture gas in the atmospheric pressure plasma 11. Numeral 4 designates a glass fabric arranged between the electrodes 2 and 3. It is preferred that the glass fabric 4 is arranged between the electrodes so as to keep a floated state thereof. The apparatus has a pair of feed and take-up reels (not shown) used for continuously supplying a long sheet of the glass fabric 4 into the reaction chamber 1, and a motor (not shown) for driving those reels to transfer the long sheet at a predetermined feed speed in a longitudinal direction of the reaction chamber 1, as shown by the arrow of FIG. 1. Therefore, it is possible to continuously expose such a long sheet of the glass fabric 4 to the atmospheric pressure plasma 11. A plasma treatment time may be determined by the feed speed of the glass fabric. For example, it is possible to complete the first step within about 20 min.

A carrier gas is supplied to the reaction chamber 1 from a carrier gas bomb 9 through the gas inlet 7. An alternating-current power is applied to the electrodes 2 and 3 to generate a glow discharge of the carrier gas between the electrodes. Subsequently, the reaction gas is supplied from a reaction gas bomb 10 to the reaction chamber 1 through a gas mixing equipment 8 to obtain the atmospheric pressure plasma 11 of the mixture gas. A flow rate of the reaction gas is controlled to obtain a requested mixture ratio of the reaction gas to the carrier gas. The mixture gas is pre-heated at a requested temperature by a heater 12 prior to the supply to the reaction chamber 1. It is preferred to supply the mixture gas so as to blow against the glass fabric. It is also preferred that the mixture gas supplied to the reaction chamber is forcedly stirred within the reaction chamber 1 with the use of a fan (not shown).

It is preferred that the mixture gas is pre-heated at a temperature between 100° C. to 600° C. prior to the plasma excitation. In this case, it is confirmed that a residual carbon amount on the glass fabric is considerably decreased by the first step, so that the adhesion between a resin and the glass fabric can be improved. It is believed that when the mixture gas is pre-heated at the temperature, radicals and ions in the atmospheric pressure plasma attack strongly the glass fabric, so that a reaction speed of the mixture gas to an organic compound as a sizing agent or the residual carbon on the glass fabric is increased. It is also believed that since a plasma cleaning is efficiently and uniformly performed over the entire surface of the glass fabric, and a finely-roughened surface is formed on the glass fabric during the first step, the adhesion between the resin and the glass fabric can be improved. When the mixture gas is pre-heated at a temperature less than 100° C., the plasma treatment time required to obtain the improved adhesion is increased because the reaction speed is a relatively slow. When the mixture gas is pre-heated at a temperature more than 600° C., the glass fiber would be softened.

It is preferred that at least one of an oxidative gas and a fluorine-containing gas is used as the reaction gas. When a mixture of the oxidative gas and fluorine-containing gas is used as the reaction gas, a mixture ratio of the oxidative gas to the fluorine-containing gas may be preferably selected from the range of 1/3 to 3/1.

It is also preferred that the glass fabric is exposed to a first atmospheric pressure plasma of a first reaction gas containing the oxidative gas, and then a second atmospheric pressure plasma of a second reaction gas containing the fluorine-containing gas. In the first plasma, the organic compound or carbon left on the glass fabric is converted in the form of carbon dioxide, and removed from the glass fabric together with the moisture and impurity adsorbed on the glass fabric. It is preferred that the oxidative gas is at least one gas selected from the group consisting of oxygen, air, and carbon dioxide. In the second plasma, a surface of the glass fabric is etched, while the organic compound or residual carbon is removed from the glass fabric together with the moisture and impurity. That is, silicon oxide of the glass fabric is etched by reacting with fluorine in the second reaction gas. The entire surface of the glass fabric is finely and uniformly roughened by the second plasma. The finely-roughened surface of the glass fabric is useful to improve the adhesion between the resin and glass fabric.

It is also preferred that one of a hydrogen-containing gas and a mixture of hydrogen gas and the fluorine-containing gas is used as the reaction gas. In case of using the hydrogen-containing gas, the organic compound or the residual carbon on the glass fabric is converted in the form of hydrocarbon, and removed from the glass fabric together with the moisture and impurity to obtain a cleaned and active surface of the glass fabric. In particular, the addition of hydrogen gas to the fluorine-containing gas enhances the plasma excitation of the fluorine-containing gas to improve a reaction speed of the atmospheric pressure plasma to the glass fabric. When a mixture of hydrogen gas and the fluorine-containing gas is used as the reaction gas, a mixture ratio of the hydrogen gas to the fluorine-containing gas may be preferably selected from the range of 1/3 to 3/1. It is preferred that the fluorine-containing gas is at least one gas selected from the group consisting of hydrofluoride (HF), sulfur hexafluoride ($SF_6$), fluorine, nitrogen trifluoride ($NF_3$), carbon tetrafluoride ($CF_4$), trifluoromethane ($CHF_3$), and dicarbon hexafluoride ($C_2F_6$).

It is preferred that the mixture gas contains a rare gas such as argon and/or helium as a carrier gas of the reaction gas. It is also preferred that a concentration of the reaction gas in the mixture gas is 15 vol % or less.

It is further preferred to perform the first step of the present invention in place of a heat-cleaning treatment for removing the organic compound from the glass fabric including the organic compound. In addition, it is possible to perform the first step after the heat-cleaning treatment. That is, the organic compound or the residual carbon left on the glass fabric after the heat-cleaning treatment can be removed by the first step. Since the finely-roughened surface can be formed on the glass fabric by the first step, it is possible to provide an improved adhesion between the glass fabric and the organosilane compound formed in the second step of the present invention. Additionally, as shown in FIG. 1, since the first step uses the atmospheric pressure plasma, it is easy to continuously perform the first step to the glass fabric even when the glass fabric is provided in the shape of a long sheet. As a result, the first step of the present invention can provide an increased production rate of the glass fabric having the plasma-treated surface with the use of a relatively inexpensive and simple plasma-reaction apparatus.

In the second step of the present invention, the organosilane compound is coated on the plasma-treated surface of the glass fabric to improve the wettability of the resin to the glass fabric. The organosilane compound is known as a coupling agent. For example, a solution including the coupling agent is impregnated into the glass fabric by means of dipping or spraying, and then dried. The solution substantially consists of the organosilane compound and a solvent such as alcohol or water. It is preferred that a concentration of the organosilane compound in the solution is in the range 0.1 to 2 wt %. The organosilane compound comprises vinylmethoxy-silane, vinylphenyltrimethoxy-silane, 3-methacryloxypropyltrimethoxy-silane, 3-glycidoxypropyltrimethoxy-silane, 3-aminopropyltriethoxy-silane, 4-glycidylbutyltrimethoxy-silane, N-2-(aminoethyl)-3-aminopropyltrimethoxy-silane, N-2-(N-vinylbenzylaminoethyl)-3-aminopropyltrimethoxyo-silane hydrochloride, N-3-(4-(3-aminopropoxy)butoxy)propyl-3-aminopropyltrimethoxy-silane, 3-mercaptopropyltrimethoxy-silane, imidazole-silane, or the like.

It is preferred that the organosilane compound is coated on the plasma-treated surface of the glass fabric by a plasma polymerization method. A mixture gas of a vaporized gas of an organosilane monomer and a rare gas as a carrier gas, e.g., argon and/or helium, can be used for the plasma polymerization method. The plasma-treated surface of the glass fabric is exposed to an atmospheric pressure plasma of the mixture gas to coat the organosilane compound thereon. In addition to the above listed organosilane compounds, the organosilane monomer comprises tetramethoxy-silane, trimethoxy-silane, triethoxy-silane, vinyltriethoxy-silane, hexamethyl-disilane, tetraethoxy-silane, hexamethyl-disiloxane, or the like. When the plasma reaction apparatus of FIG. 1 is modified to supply the vaporized organosilane gas together with the carrier gas into the reaction chamber, it is possible to basically use the modified apparatus to perform the plasma polymerization method. It is preferred that a small amount of oxygen is added to the mixture gas to enhance the coating of the organosilane compound. It is also preferred that a temperature of the mixture gas of the vaporized gas and rare gas in the plasma zone is in the range of 100° C. and 500° C. to improve the adhesion between the glass fabric and the organosilane compound and prevent the occurrence of the CAF.

The glass fabric used in the present process comprises a glass fabric including a large amount of the organic compound as the sizing agent without the heat-cleaning treatment, and a glass fabric including a small amount, e.g., 0.1% or less, of the organic compound or the residual carbon, to which the heat-cleaning treatment is performed prior to the first step of the present invention. The organic compound comprises a starch, polyvinyl alcohol, or the like. In particular, when the first step is performed to the later glass fabric, the residual carbon can be almost completely removed from the glass fabric, and the formation of a finely-roughened surface of the glass fabric is enhanced.

EXAMPLES 1 TO 8

Glass yarns (Japanese Industrial Standard (JIS): E type) were woven while applying an organic compound as a sizing agent thereto, so that glass fabrics including the organic compound were obtained. The glass fabric corresponds to a glass cloth of JIS 3414-EP18. Subsequently, surface treatments of the present invention were performed to the glass fabrics in accordance with process conditions shown on TABLES 1 and 2 to obtain products of EXAMPLES 1 to 8.

For example, the product of EXAMPLE 1 was prepared as follows. In a first plasma treatment, the glass fabric was exposed to a first atmospheric pressure plasma of a first mixture gas of oxygen as a first reaction gas and helium as a carrier gas. Flow rates of the first reaction gas and carrier gas are 0.04 L(liter)/min and 1.96 L(liter)/min, respectively. An alternating current power source of the frequency of 13.56 MHz was used for the plasma excitation of the first plasma. The first mixture gas was pre-heated at the temperature of 150° C. by a heater prior to the plasma excitation.

The glass fabric was kept in the first plasma for 5 min to obtain a cleaned surface of the glass fabric.

In a second plasma treatment, the cleaned surface of the glass fabric was exposed to a second atmospheric pressure plasma of a second mixture gas of carbon tetrafluoride ($CF_4$) as a second reaction gas and helium as a carrier gas. Flow rates of the second reaction gas and carrier gas are 0.06 L/min and 1.94 L/min, respectively. The alternating current power source of the frequency of 13.56 MHz was used for the plasma excitation of the second plasma. The second mixture gas was not heated prior to the plasma excitation. The glass fabric was kept in the second plasma for 5 min to obtain a plasma-treated surface of the glass fabric.

In a third plasma treatment, the plasma-treated surface of the glass fabric was exposed to a third atmospheric pressure plasma of a third mixture gas of 3-aminopropyltriethoxy-silane gas as an organosilane gas and helium as a carrier to coat an organosilane compound on the plasma-treated surface. The organosilane gas was prepared by vaporizing an organosilane monomer. A supply rate of the organosilane gas is 50 mg/min. The supply rate was measured by a mass spectrometer. A flow rate of the carrier gas is 2.0 L/min. An alternating current power source of the frequency of 13.56 MHz was used for the plasma excitation of the third plasma. The third mixture gas was not heated prior to the plasma excitation. The glass fabric was kept in the third plasma for 5 min to obtain the product of EXAMPLE 1.

In each of EXAMPLES 4, 5 and 8, a dip treatment was performed after the second plasma treatment in place of the third plasma treatment. For example, in EXAMPLE 4, the dip treatment was performed by impregnating an aqueous solution of 3-aminopropyltriethoxy-silane into the glass fabric. The concentration of 3-aminopropyltriethoxy-silane in the aqueous solution is 2%. After the dip treatment, the glass fabric was dried at the temperature of 150° C. for 60 minutes to obtain the product of EXAMPLE 4.

EXAMPLES 9 TO 19

Glass yarns (Japanese Industrial Standard (JIS): E type) were woven while applying an organic compound as a sizing agent thereto, so that glass fabrics including the organic compound were obtained. The glass fabric corresponds to a glass cloth of JIS 3414-EP18. A heat-cleaning treatment was performed to the glass fabrics at the temperature of 400° C. for 48 hours to remove the organic compound from the glass fabrics. After the heat-cleaning treatment, it was confirmed that 0.08% of carbon was left on the glass fabric as a residual carbon. Subsequently, surface treatments of the present invention were performed to the glass fabrics in accordance with process conditions shown on TABLES 3 to 5 to obtain products of EXAMPLES 9 to 19.

For example, the product of EXAMPLE 13 was prepared as follows. In a first plasma treatment, the glass fabric was exposed to a first atmospheric pressure plasma of a first mixture gas of sulfur hexafluoride ($SF_6$) and hydrogen as first reaction gases and helium and argon as carrier gases. Flow rates of sulfur hexafluoride ($SF_6$) and hydrogen are 0.05 L/min, respectively. Flow rates of helium and argon are 1.00 L/min and 0.90 L/min, respectively. An alternating current power source of the frequency of 2 MHz was used for the plasma excitation of the first plasma. The first mixture gas was pre-heated at the temperature of 350° C. by a heater prior to the plasma excitation. The glass fabric was kept in the first plasma for 5 min to obtain a plasma-treated surface of the glass fabric.

In a second plasma treatment, the plasma-treated surface of the glass fabric was exposed to a second atmospheric pressure plasma of a second mixture gas of hexamethyldisiloxane gas as an organosilane gas and helium as a carrier to coat an organosilane compound on the plasma-treated surface. The organosilane gas was prepared by vaporizing an organosilane monomer. A supply rate of the organosilane gas is 20 mg/min. The supply rate was measured by a mass spectrometer. A flow rate of the carrier gas is 2.0 L/min. An alternating current power source of the frequency of 15 KHz was used for the plasma excitation of the second plasma. The second mixture gas was pre-heated at the temperature of 200° C. prior to the plasma excitation. The glass fabric was kept in the second plasma for 10 min to obtain the product of EXAMPLE 13.

In each of EXAMPLES 10, 15, 16, and 18, a dip treatment was performed after the first plasma treatment in place of the second plasma treatment. For example, in EXAMPLE 16, the dip treatment was performed by impregnating an ethanol solution of 3-glycidoxypropyltrimethoxy-silane into the glass fabric. The concentration of 3-glycidoxypropyltrimethoxy-silane in the ethanol solution is 2%. After the dip treatment, the glass fabric was dried at the temperature of 100° C. for 60 minutes to obtain the product of EXAMPLE 16.

COMPARATIVE EXAMPLE 1

A glass fabric including an organic compound, which is the same as that used in EXAMPLE 1, was used in COMPARATIVE EXAMPLE 1. A heat-cleaning treatment was performed in an electric furnace at the temperature of 400° C. for 48 hours to remove the organic compound from the glass fabric. Then, the glass fabric was dipped into an aqueous solution of 3-aminopropyltriethoxy-silane for 1 minute, and then dried at the temperature of 150° C. for 60 minutes to obtain a product of COMPARATIVE EXAMPLE 1. The concentration of 3-aminopropyltriethoxy-silane in the aqueous solution is 2 wt %.

COMPARATIVE EXAMPLE 2

A product of COMPARATIVE EXAMPLE 2 was prepared in accordance with the same process of EXAMPLE 1 except that the first mixture gas was not heated prior to the plasma excitation of the first plasma. In this case, it was confirmed that a temperature of the first mixture gas in a plasma zone of the first plasma is in the range of a room temperature to 70° C.

COMPARATIVE EXAMPLE 3

A product of COMPARATIVE EXAMPLE 3 was prepared in o accordance with the same process of EXAMPLE 4 except that the second mixture gas was not heated prior to the plasma excitation of the second plasma. In this case, it was confirmed that a temperature of the second mixture gas in a plasma zone of the second plasma is in the range of a room temperature to 70° C.

COMPARATIVE EXAMPLE 4

A product of COMPARATIVE EXAMPLE 4 was prepared in accordance with the same process of EXAMPLE 5 except that the second mixture gas was not heated prior to the plasma excitation of the second plasma. In this case, it was confirmed that a temperature of the second mixture gas in a plasma zone of the second plasma is in the range of a room temperature to 70° C.

COMPARATIVE EXAMPLE 5

A product of COMPARATIVE EXAMPLE 5 was prepared in accordance with the same process of EXAMPLE 6 except that the first mixture gas was not heated prior to the plasma excitation of the first plasma. In this case, it was confirmed that a temperature of the first mixture gas in a plasma zone of the first plasma is in the range of a room temperature to 70° C.

COMPARATIVE EXAMPLE 6

A product of COMPARATIVE EXAMPLE 6 was prepared in accordance with the same process of EXAMPLE 7 except that the second mixture gas was not heated prior to the plasma excitation of the second plasma. In this case, it was confirmed that a temperature of the second mixture gas in a plasma zone of the second plasma is in the range of a room temperature to 70° C.

COMPARATIVE EXAMPLE 7

A product of COMPARATIVE EXAMPLE 7 was prepared in accordance with the same process of EXAMPLE 8 except that the second mixture gas was not heated prior to the plasma excitation of the second plasma. In this case, it was confirmed that a temperature of the second mixture gas in a plasma zone of the second plasma is in the range of a room temperature to 70° C.

The following experiments 1–3 were performed with respect to the products of EXAMPLES 1–19 and COMPARATIVE EXAMPLES 1–7.

[1] EXPERIMENT 1

A residual carbon amount left on the glass fabric immediately before the coating of the organosilane compound was measured by the use of a carbon mass spectrometer. Results are listed on TABLE 6.

[2] EXPERIMENT 2

Figure 2:
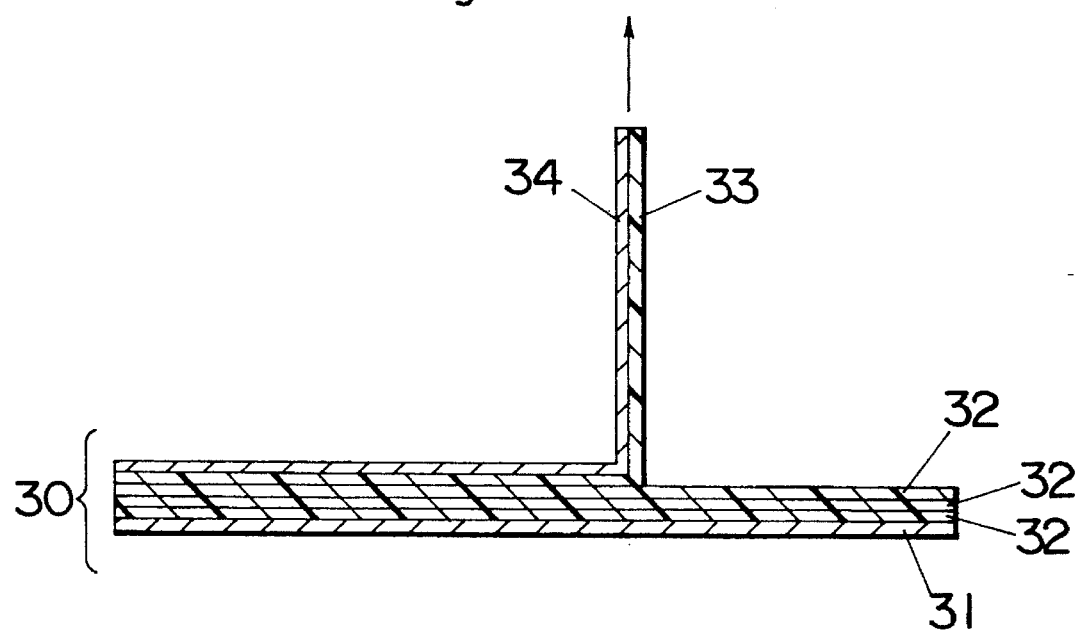
FIG. 2 is a schematic diagram helpful for understanding a method of measuring an adhesion strength between a resin and a glass fabric.

For estimating an adhesion strength between a resin and each of the products of EXAMPLES 1–19 and COMPARATIVE EXAMPLES 1–7, a copper clad laminate was manufactured, and an adhesion strength between prepregs of the copper clad laminate was measured as follows. An epoxy resin varnish was prepared by dissolving a brominated bisphenol-A type epoxy resin, dicyandiamide as a curing agent and 2- ethyl-4-methyl-imidazole as a catalyst into methylcellosolve as a solvent. The varnish was impregnated into each of the products, and then dried at the temperature of 150° C. for 8 min to obtain the prepreg. A resin content in the prepreg is in the range of 43 to 46 wt %. A melting viscosity of the epoxy resin in the prepreg is in a range of 400 to 700 poises at 130° C. It took 120 to 160 seconds as a required time for gelation at 170° C. After four prepregs were stacked to obtain a prepreg assembly, the assembly was sandwiched between a pair of copper foils of 18 μm thick. The prepreg assembly having the copper foils was compressed under 40 kg/cm$^2$ at 170° C. for 90 minutes to obtain the copper clad laminate. As shown in FIG. 2, when an upper prepreg 33 with a top copper foil 34 of the clad laminate 30 was separated from lower prepregs 32 with a bottom copper foil 31 of the clad laminate 30 by a vertical force, the adhesion strength between the prepregs was determined in accordance with the vertical force. Results are listed on TABLE 6.

[3] EXPERIMENT 3

Figure 3:
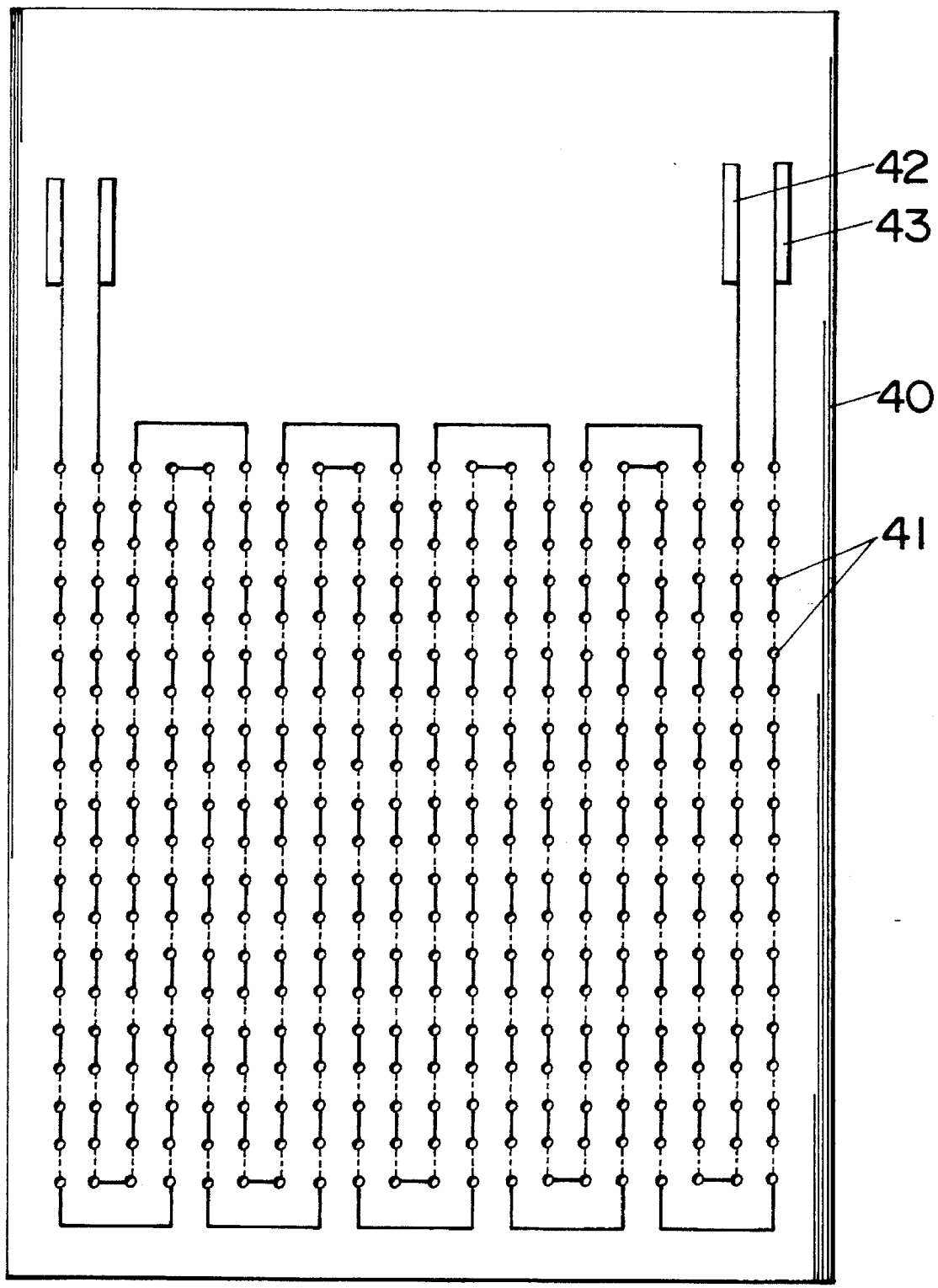
FIG. 3 is a plan view of a copper clad laminate prepared to estimate a resistance to CAF (Conductive Anodic Filaments).

A resistance to CAF (Conductive Anodic Filaments) of a prepreg was estimated as follows. Eight prepregs, each of which is the same as that used in the experiment 2, were stacked to obtain a prepreg assembly. The prepreg assembly was sandwiched between a pair of copper foils of 18 μm thick. The prepreg assembly having the copper foils was compressed under 40 kg/cm$^2$ at 170° C. for 90 minutes to obtain a copper clad laminate 40 having the thickness of 1.6 mm. As shown in FIG. 3, four hundreds through-holes 41 having the diameter of 0.9 mm were drilled in the clad laminate 40. Subsequently, top and bottom circuit patterns were formed on the clad laminate. In FIG. 3, solid lines connecting to through-holes 41 designates the top circuit patterns, and dotted lines connecting to the though-holes 41 designates the bottom circuit patterns. A copper plating was performed to the through-holes 41 to connect the top circuit patterns with the bottom circuit patterns. When a direct-current voltage of 35 V was applied between electrodes 42 and 43 on the clad laminate 40 under an atmosphere with the temperature of 85° C. and the relative humidity of 85%, a time period necessary for causing a short-circuit was measured as a value indicative of the resistance to CAF. Therefore, as the time period necessary for causing the short-circuit is extended, it would be understood that the resistance to CAF is more improved. Results are listed on TABLE 6.

Each of the residual carbon contents of the glass fabrics of EXAMPLES 1–9 is equal to or less than that of the glass fabric of COMPARATIVE EXAMPLE 1. Therefore, the organic compound can be efficiently removed from the glass fabric by performing the plasma treatment of the present invention for several minutes in place of performing the heat-cleaning treatment of the prior art for several ten hours. When the results of the experiments 1–3 with respect to EXAMPLES 1 and 4–8 are compared with those with respect to COMPARATIVE EXAMPLES 2–7, it would be understood that the preheating of the first mixture gas and/or second mixture gas prior to the plasma excitation is useful to provide more improved adhesion strength and resistance to CAF to the clad laminates. In addition, as evidenced by EXAMPLES 9–19, it is preferred to perform the surface treatment of the present invention after the heat-cleaning treatment to obtain good copper clad laminates.

TABLE 1

|  | EXAMPLE 1 | EXAMPLE 2 | EXAMPLE 3 | EXAMPLE 4 |
| --- | --- | --- | --- | --- |
| First Plasma: | | | | |
| Output Power: | 500 W | 500 W | 500 W | 700 W |
| Frequency: | 13.56 MHz | 13.56 MHz | 13.56 MHz | 5.0 MHz |
| Gas Temperature: | 150° C. | No-heat | 150° C. | No-heat |
| Treatment Time: | 5 min | 5 min | 5 min | 10 min |

TABLE 1-continued

|  | EXAMPLE 1 | EXAMPLE 2 | EXAMPLE 3 | EXAMPLE 4 |
|---|---|---|---|---|
| Carrier Gas: | He | He | He | He |
| Flow Rate: | 1.96 L/min | 1.96 L/min | 1.96 L/min | 1.90 L/min |
| Reaction Gas: | $O_2$ | $O_2$ | $O_2$ | $O_2$ |
| Flow Rate: | 0.04 L/min | 0.04 L/min | 0.04 L/min | 0.10 L/min |
| Second Plasma: | | | | |
| Output Power: | 500 W | 500 W | 500 W | 700 W |
| Frequency: | 13.56 MHz | 13.56 MHz | 13.56 MHz | 5.0 MHz |
| Gas Temperature: | No-heat | 150° C. | 150° C. | 250° C. |
| Treatment Time: | 5 min | 5 min | 5 min | 10 min |
| Carrier Gas: | He | He | He | He |
| Flow Rate: | 1.94 L/min | 1.94 L/min | 1.94 L/min | 1.94 L/min |
| Reaction Gas: | $CF_4$ | $CF_4$ | $CF_4$ | $CF_4$ |
| Flow Rate: | 0.06 L/min | 0.06 L/min | 0.06 L/min | 0.06 L/min |
| Third Plasma: | | | | Not performed |
| Output Power: | 500 W | 500 W | 500 W | |
| Frequency: | 13.56 MHz | 13.56 MHz | 13.56 MHz | |
| Gas Temperature: | No-heat | No-heat | 150° C. | |
| Treatment Time: | 5 min | 5 min | 5 min | |
| Carrier Gas: | He | He | He | |
| Flow Rate: | 2.0 L/min | 2.0 L/min | 2.0 L/min | |
| Organosilane Gas: | 3-amino-propyl-triethoxy-silane | 3-amino-propyl-triethoxy-silane | 3-amino-propyl-triethoxy-silane | |
| Supply Rate: | 50 mg/min | 50 mg/min | 50 mg/min | |
| Dip Treatment: Organosilane: | Not performed | Not performed | Not performed | 3-amino-propyl-triethoxy-silane |
| Concentration: | | | | 2% |
| Solvent: | | | | Water |
| Temperature: | | | | 150° C. |
| Drying Time: | | | | 60 min |

TABLE 2

|  | EXAMPLE 5 | EXAMPLE 6 | EXAMPLE 7 | EXAMPLE 8 |
|---|---|---|---|---|
| First Plasma: | Not performed | | Not performed | Not performed |
| Output Power: | | 500 W | | |
| Frequency: | | 2.0 MHz | | |
| Gas Temperature: | | 300° C. | | |
| Treatment Time: | | 10 min | | |
| Carrier Gas: | | He + Ar | | |
| Flow Rate: | | He: 1.5 L/min Ar: 0.4 L/min | | |
| Reaction Gas: | | Air | | |
| Flow Rate: | | 0.10 L/min | | |
| Second Plasma: | | Not performed | | |
| Output Power: | 400 W | | 500 W | 400 W |
| Frequency: | 10.0 MHz | | 5.0 MHz | 10.0 MHz |
| Gas Temperature: | 250° C. | | 300° C. | 300° C. |
| Treatment Time: | 10 min | | 20 min | 10 min |
| Carrier Gas: | He | | He | He |
| Flow Rate: | 1.90 L/min | | 1.90 L/min | 1.90 L/min |
| Reaction Gas: | $C_2F_6$ | | $CF_4$ | $CF_4 + O_2$ |
| Flow Rate: | 0.10 L/min | | 0.10 L/min | $CF_4$: 0.05 L/min $O_2$: 0.05 L/min |
| Third Plasma: | Not performed | | | Not performed |
| Output Power: | | 200 W | 200 W | |
| Frequency: | | 10.0 MHz | 15 KHz | |
| Gas Temperature: | | 200° C. | No-heat | |
| Treatment Time: | | 10 min | 10 min | |
| Carrier Gas: | | He + $O_2$ | He | |
| Flow Rate: | | He: 1.95 L/min $O_2$: 0.05 L/min | 2.0 L/min | |
| Organosilane Gas: | | Tetraethoxy- | Hexamethyl- | |

TABLE 2-continued

|  | EXAMPLE 5 | EXAMPLE 6 | EXAMPLE 7 | EXAMPLE 8 |
|---|---|---|---|---|
| Supply Rate: |  | silane 10 mg/min | disiloxane 20 mg/min |  |
| Dip Treatment: |  | Not performed | Not performed |  |
| Organosilane: | 3-glycidoxy-propyl-trimethoxy-silane |  |  | 3-amino-propyl-triethoxy-silane |
| Concentration: | 2% |  |  | 1% |
| Solvent: | Ethanol |  |  | Ethanol |
| Temperature: | 100° C. |  |  | 150° C. |
| Drying Time: | 60 min |  |  | 60 min |

TABLE 3

|  | EXAMPLE 9 | EXAMPLE 10 | EXAMPLE 11 | EXAMPLE 12 |
|---|---|---|---|---|
| First Plasma: |  |  |  |  |
| Output Power: | 500 W | 700 W | 700 W | 500 W |
| Frequency: | 13.56 MHz | 5 MHz | 10 MHz | 500 KHz |
| Gas Temperature: | 150° C. | 200° C. | 250° C. | 300° C. |
| Treatment Time: | 5 min | 10 min | 5 min | 5 min |
| Carrier Gas: | He | He | Ar | He |
| Flow Rate: | 1.94 L/min | 1.94 L/min | 1.90 L/min | 1.90 L/min |
| Reaction Gas: | $CF_4$ | $C_2F_6$ | $O_2 + CF_4$ | $O_2$ |
| Flow Rate: | 0.06 L/min | 0.06 L/min | $O_2$: 0.05 L/min $CF_4$: 0.05 L/min | 0.10 L/min |
| Second Plasma: |  | Not performed |  |  |
| Output Power: | 500 W |  | 500 W | 500 W |
| Frequency: | 13.56 MHz |  | 13.56 MHz | 13.56 MHz |
| Gas Temperature: | 50° C. |  | 150° C. | 150° C. |
| Treatment Time: | 5 min |  | 5 min | 5 min |
| Carrier Gas: | He |  | He | He |
| Flow Rate: | 2.0 L/min |  | 2.0 L/min | 2.0 L/min |
| Organosilane Gas: | 3-amino-propyl-triethoxy-silane |  | 3-amino-propyl-triethoxy-silane | Tetraethoxy-silane |
| Supply Rate: | 50 mg/min |  | 50 mg/min | 50 mg/min |
| Dip Treatment: | Not performed | | Not performed | Not performed |
| Organosilane: |  | 3-amino-propyl-triethoxy-silane |  |  |
| Concentration: |  | 2% |  |  |
| Solvent: |  | Water |  |  |
| Temperature: |  | 150° C. |  |  |
| Drying Time: |  | 60 min |  |  |

TABLE 4

|  | EXAMPLE 13 | EXAMPLE 14 | EXAMPLE 15 | EXAMPLE 16 |
|---|---|---|---|---|
| First Plasma: |  |  |  |  |
| Output Power: | 500 W | 1000 W | 700 W | 400 W |
| Frequency: | 2 MHz | 500 KHz | 5.0 MHz | 10.0 MHz |
| Gas Temperature: | 350° C. | 200° C. | 250° C. | 250° C. |
| Treatment Time: | 5 min | 10 min | 10 min | 10 min |
| Carrier Gas: | He + Ar | Ar | Ar | He |
| Flow Rate: | He: 1.0 L/min Ar: 0.90 L/min | 1.94 L/min | 1.94 L/min | 1.90 L/min |
| Reaction Gas: | $SF_6 + H_2$ | HF | $H_2$ | $C_2F_6 + H_2$ |
| Flow Rate: | $SF_6$: 0.05 L/min | 0.06 L/min | 0.06 L/min | $C_2F_6$: 0.05 L/min |

TABLE 4-continued

| | EXAMPLE 13 | EXAMPLE 14 | EXAMPLE 15 | EXAMPLE 16 |
|---|---|---|---|---|
| | $H_2$: 0.05 L/min | | | $H_2$: 0.05 |
| Second Plasma: | | | Not performed | Not performed |
| Output Power: | 200 W | 500 W | | |
| Frequency: | 15 KHz | 500 KHz | | |
| Gas Temperature: | 200° C. | 150° C. | | |
| Treatment Time: | 10 min | 10 min | | |
| Carrier Gas: | He | He | | |
| Flow Rate: | 2.0 L/min | 2.0 L/min | | |
| Organosilane Gas: | Hexamethyl-disiloxane | 3-amino-propyl-triethoxy-silane | | |
| Supply Rate: | 20 mg/min | 50 mg/min | | |
| Dip Treatment: | Not performed | Not performed | | |
| Organosilane: | | | 3-amino-propyl-triethoxy-silane | 3-glycidoxy-propyl-trimethoxy-silane |
| Concentration: | | | 2% | 2% |
| Solvent: | | | Water | Ethanol |
| Temperature: | | | 150° C. | 100° C. |
| Drying Time: | | | 60 min | 60 min |

TABLE 5

| | EXAMPLE 17 | EXAMPLE 18 | EXAMPLE 19 |
|---|---|---|---|
| First Plasma: | | | |
| Output Power: | 500 W | 500 W | 500 W |
| Frequency: | 100 KHz | 13.56 MHz | 10.0 MHz |
| Gas Temperature: | 300° C. | 50° C. | 50° C. |
| Treatment Time: | 15 min | 5 min | 10 min |
| Carrier Gas: | He | He | He |
| Flow Rate: | 1.90 L/min | 1.94 L/min | 1.90 L/min |
| Reaction Gas: | $CF_4$ | $CF_4$ | $CF_4 + O_2$ |
| Flow Rate: | 0.1 L/min | 0.06 L/min | $CF_4$: 0.05 L/min $O_2$: 0.05 L/min |
| Second Plasma: | | Not performed | |
| Output Power: | 200 W | | 500 W |
| Frequency: | 15 KHz | | 13.56 MHz |
| Gas Temperature: | 150° C. | | 50° C. |
| Treatment Time: | 10 min | | 5 min |
| Carrier Gas: | He | | He |
| Flow Rate: | 2.0 L/min | | 2.0 L/min |
| Organosilane Gas: | Hexamethyl-disiloxane | | 3-amino-propyl-triethoxy-silane |
| Supply Rate: | 20 mg/min | | 50 mg/min |
| Dip Treatment: | Not performed | | Not performed |
| Organosilane: | | 4-glycidyl-butyl-trimethoxy-silane | |
| Concentration: | | 1% | |
| Solvent: | | Ethanol | |
| Temperature: | | 100° C. | |
| Drying Time: | | 60 min | |

TABLE 6

| | Residual carbon Content (%) | Adhesion Strength (kg/cm) | Resistance to CAF (hours) |
|---|---|---|---|
| EXAMPLE 1 | 0.06 | 2.3 | 2400 |
| EXAMPLE 2 | 0.06 | 2.5 | 2550 |
| EXAMPLE 3 | 0.06 | 2.6 | 2650 |
| EXAMPLE 4 | 0.08 | 2.5 | 2550 |
| EXAMPLE 5 | 0.06 | 2.6 | 2500 |
| EXAMPLE 6 | 0.06 | 2.3 | 2400 |
| EXAMPLE 7 | 0.06 | 2.5 | 2600 |
| EXAMPLE 8 | 0.06 | 2.5 | 2600 |
| EXAMPLE 9 | 0.03 | 2.5 | 2500 |
| EXAMPLE 10 | 0.03 | 2.7 | 2750 |
| EXAMPLE 11 | 0.02 | 2.6 | 2700 |
| EXAMPLE 12 | 0.04 | 2.5 | 2600 |
| EXAMPLE 13 | 0.02 | 2.7 | 2650 |
| EXAMPLE 14 | 0.02 | 2.6 | 2550 |
| EXAMPLE 15 | 0.04 | 2.4 | 2500 |
| EXAMPLE 16 | 0.03 | 2.8 | 2800 |
| EXAMPLE 17 | 0.03 | 2.7 | 2600 |
| EXAMPLE 18 | 0.05 | 2.5 | 2500 |
| EXAMPLE 19 | 0.06 | 2.4 | 2450 |
| COMPARATIVE EXAMPLE 1 | 0.08 | 1.5 | 1500 |
| COMPARATIVE EXAMPLE 2 | 0.08 | 2.1 | 2100 |
| COMPARATIVE EXAMPLE 3 | 0.08 | 1.9 | 2000 |
| COMPARATIVE EXAMPLE 4 | 0.08 | 2.0 | 2100 |
| COMPARATIVE EXAMPLE 5 | 0.07 | 1.8 | 1950 |
| COMPARATIVE EXAMPLE 6 | 0.08 | 2.0 | 2050 |
| COMPARATIVE EXAMPLE 7 | 0.08 | 2.0 | 2000 |

What is claimed is:

1. A process for a surface treatment of a glass fabric, said process comprising the steps of:

exposing a glass fabric to an atmospheric pressure plasma of a mixture gas including a reaction gas to obtain a plasma-treated surface of said glass fabric, said mixture gas being pre-heated to a temperature between 100° C. to 500° C. prior to a plasma excitation thereof; and coating an organosilane compound on the plasma-treated surface of said glass fabric.

2. A process as set forth in claim 1, wherein said organosilane compound is coated on said plasma-treated surface by exposing said plasma-treated surface to a second atmospheric pressure plasma of a second mixture gas containing a vaporized gas of an organosilane monomer.

3. A process as set forth in claim 2, wherein said second mixture gas is heated at a temperature of 100° C. to 500° C. prior to a plasma excitation thereof.

4. A process as set forth in claim 1, wherein a heat-cleaning treatment is performed to said glass fabric prior to said exposing step.

5. A process for a surface treatment of a glass fabric including an organic compound, said process comprising the steps of:

removing organic compound from a glass fabric in an atmospheric pressure plasma of a mixture gas to obtain a plasma-treated surface of said glass fabric, said mixture gas containing as a reaction gas at least one of an oxidative gas and a fluorine-containing gas, and a rare gas as a carrier of said reaction gas, said mixture gas being pre-heated to a temperature between 50° C. and 600° C. prior to a plasma excitation thereof; and coating an organosilane compound on the plasma-treated surface of said glass fabric.

6. A process for a surface treatment of a glass fabric, said process comprising the steps of:

exposing a glass fabric to an atmospheric pressure plasma of a mixture gas including a reaction gas to obtain a plasma-treated surface of said glass fabric, said mixture gas being pre-heated to a temperature between 50° C. to 600° C. prior to a plasma excitation thereof; and coating an organosilane compound on the plasma-treated surface of said glass fabric.

7. A process as set forth in claim 6, wherein said reaction gas is at least one of an oxidative gas and a fluorine-containing gas.

8. A process as set forth in claim 7, wherein said oxidative gas is at least one gas selected from the group consisting of oxygen, air, and carbon dioxide.

9. A process as set forth in claim 7, wherein said fluorine-containing gas is at least one gas selected from the group consisting of hydrofluoride (HF), sulfur hexafluoride ($SF_6$), fluorine, nitrogen trifluoride ($NF_3$), carbon tetrafluoride ($CF_4$), trifluoromethane ($CHF_3$), and dicarbon hexafluoride ($C_2F_6$).

10. A process as set forth in claim 6, wherein said exposing step comprises the sub-steps of:

exposing said glass fabric to a first atmospheric pressure plasma of a first reaction gas containing an oxidative gas to obtain a pre-treated surface of said glass fabric; and exposing said pre-treated surface to a second atmospheric pressure plasma of a second reaction gas containing a fluorine-containing gas to obtain said plasma-treated surface of said glass fabric.

11. A process as set forth in claim 6, wherein said reaction gas is one of a hydrogen-containing gas and a mixture of hydrogen gas and a fluorine-containing gas.

12. A process as set forth in claim 6, wherein said organosilane compound is coated on said plasma-treated surface of said glass fabric by impregnating a solution containing said organosilane compound into said glass fabric, and drying said solution in said glass fabric.

13. A process as set forth in claim 6, wherein said plasma is excited by using an alternating current power source of a frequency of 50 Hz to 13.

14. A process for a surface treatment of a glass fabric, said process comprising the steps of:

exposing a glass fabric to an atmospheric pressure plasma of a mixture gas including a reaction gas to obtain a plasma-treated surface of said glass fabric, said mixture gas being pre-heated to a temperature between 100° C. to 600° C. prior to a plasma excitation thereof; and coating an organosilane compound on the plasma-treated surface of said glass fabric.

* * * * *